(12) United States Patent
Schwandner

(10) Patent No.: US 8,388,411 B2
(45) Date of Patent: Mar. 5, 2013

(54) METHOD FOR POLISHING THE EDGE OF A SEMICONDUCTOR WAFER

(75) Inventor: Juergen Schwandner, Garching (DE)

(73) Assignee: Siltronic AG, Munich (DE)

( * ) Notice: Subject to any disclaimer, the term of this patent is extended or adjusted under 35 U.S.C. 154(b) by 499 days.

(21) Appl. No.: 12/774,025

(22) Filed: May 5, 2010

(65) Prior Publication Data

US 2010/0330885 A1 Dec. 30, 2010

(30) Foreign Application Priority Data

Jun. 24, 2009 (DE) .................... 10 2009 030 294

(51) Int. Cl.
*B24B 1/00* (2006.01)

(52) U.S. Cl. ............... 451/36; 451/41; 451/57; 451/58; 451/246; 451/256

(58) Field of Classification Search ............. 451/36, 451/44, 43, 57, 58, 246, 256
See application file for complete search history.

(56) References Cited

U.S. PATENT DOCUMENTS

| | | | | |
|---|---|---|---|---|
| 4,793,101 A * | 12/1988 | Dlouhy et al. | ........... | 451/44 |
| 5,094,037 A * | 3/1992 | Hakomori et al. | ........... | 451/11 |
| 5,097,630 A * | 3/1992 | Maeda et al. | ........... | 451/65 |
| 5,476,413 A * | 12/1995 | Hasegawa et al. | ........... | 451/168 |
| 5,609,514 A * | 3/1997 | Yasunaga et al. | ........... | 451/65 |
| 5,989,105 A | 11/1999 | Kawakawaguchi et al. | | |
| 6,066,031 A * | 5/2000 | Noguchi et al. | ........... | 451/44 |
| 6,159,081 A * | 12/2000 | Hakomori | ........... | 451/57 |
| 6,227,945 B1 * | 5/2001 | Takahashi et al. | ........... | 451/44 |
| 6,250,995 B1 * | 6/2001 | Hakomori | ........... | 451/66 |
| 6,290,580 B1 * | 9/2001 | Tanaka et al. | ........... | 451/44 |
| 6,302,769 B1 * | 10/2001 | Nishi et al. | ........... | 451/44 |
| 6,334,229 B1 * | 1/2002 | Moinpour et al. | ........... | 15/77 |
| 6,334,808 B1 * | 1/2002 | Tanaka | ........... | 451/44 |
| 6,363,599 B1 * | 4/2002 | Bajorek | ........... | 29/424 |
| 6,402,596 B1 * | 6/2002 | Hakomori et al. | ........... | 451/44 |
| 6,422,930 B2 * | 7/2002 | Hakomori | ........... | 451/325 |
| 6,602,117 B1 | 8/2003 | Chopra et al. | | |
| 6,722,954 B2 * | 4/2004 | Hashimoto et al. | ........... | 451/44 |
| 6,884,154 B2 * | 4/2005 | Mizushima et al. | ........... | 451/44 |
| 6,962,521 B2 * | 11/2005 | Mizushima | ........... | 451/44 |
| 7,121,919 B2 * | 10/2006 | Farrar | ........... | 451/5 |
| 2001/0014570 A1 | 8/2001 | Wenski et al. | | |
| 2001/0034194 A1 * | 10/2001 | Hakomori | ........... | 451/44 |
| 2002/0111120 A1 | 8/2002 | Goetz | | |
| 2002/0164930 A1 * | 11/2002 | Hakomori | ........... | 451/44 |
| 2002/0179244 A1 * | 12/2002 | Hashimoto et al. | ........... | 156/345.1 |
| 2003/0017788 A1 * | 1/2003 | Hagiwara | ........... | 451/44 |
| 2003/0153251 A1 * | 8/2003 | Mizushima | ........... | 451/44 |
| 2004/0127045 A1 * | 7/2004 | Gorantla et al. | ........... | 438/690 |
| 2005/0227590 A1 | 10/2005 | Sung | | |
| 2005/0229499 A1 | 10/2005 | Kishimoto et al. | | |
| 2006/0252355 A1 * | 11/2006 | Kumasaka | ........... | 451/44 |
| 2007/0145011 A1 * | 6/2007 | Farrar | ........... | 216/88 |
| 2009/0029552 A1 | 1/2009 | Schwandner et al. | | |
| 2009/0130960 A1 | 5/2009 | Roettger et al. | | |

FOREIGN PATENT DOCUMENTS

| | | |
|---|---|---|
| DE | 4325518 A1 | 2/1995 |
| DE | 10004578 C1 | 7/2001 |
| DE | 102007035266 A1 | 1/2009 |
| DE | 102007056122 A1 | 5/2009 |
| WO | 9213680 A1 | 8/1992 |

\* cited by examiner

*Primary Examiner* — George Nguyen
(74) *Attorney, Agent, or Firm* — Brooks Kushman P.C.

(57) ABSTRACT

A method for polishing the edge of a semiconductor wafer comprises (a) providing a semiconductor wafer which has been polished on its side surfaces and which has a rounded edge; (b) polishing the edge of the wafer by fixing the semiconductor wafer on a centrally rotating chuck, delivering the wafer to a centrally rotating polishing drum, which is inclined with respect to the chuck and to which a polishing pad containing fixedly bonded abrasives is applied, and pressing semiconductor wafer and polishing drum onto one another while a polishing agent solution containing no solids is continuously supplied.

18 Claims, No Drawings

METHOD FOR POLISHING THE EDGE OF A SEMICONDUCTOR WAFER

CROSS-REFERENCE TO RELATED APPLICATIONS

This application claims priority to German Patent Application No. DE 10 2009 030 294.8 filed Jun. 24, 2009 which is herein incorporated by reference.

BACKGROUND OF THE INVENTION

1. Field of the Invention

The invention relates to a method for polishing the edge of a semiconductor wafer.

2. Background Art

Semiconductor wafer conventionally used are usually silicon wafers or a substrate having layer structures derived from silicon (e.g. silicon-germanium). These silicon wafers are used in particular for producing semiconductor components such as memory chips (DRAM), microprocessors, sensors, light emitting diodes and many more.

The quality requirements for the edge of a semiconductor wafer are ever increasing, in particular for large diameters of the semiconductor wafer (diameter$\geq$300 mm). In particular, the edge of the semiconductor wafer should be as far as possible free of contamination and have a low roughness. Moreover, it should be resistant to increased mechanical stresses during handling. The untreated edge of a semiconductor wafer sliced from a single crystal has a comparatively rough and non-uniform surface. It often experiences spalling under mechanical loading and is a source of disturbing particles. It is therefore customary to regrind the edge in order thereby to eliminate spalling and damage in the crystal and to provide it with a specific profile.

Suitable grinding equipment is known from the prior art. It is customary for the semiconductor wafer to be fixed on a rotating table and to be delivered by its edge against the likewise rotating working surface of a machining tool. The machining tools used in this case are generally in the form of discs which are secured to a spindle and have circumferential surfaces serving as working surfaces for machining the edge of the semiconductor wafer. The material-removing grain is usually fixedly anchored in the working surfaces of the machining tools. The grain used normally has a coarse granulation. The grain size is usually specified in mesh in accordance with Japanese Industrial Standard JIS R 6001:1998. An average particle size can be calculated from the mesh figures.

If grinding discs having fine granulation are used, the term fine grinding is often also employed. Such fine grinding discs have a granulation of from 1000 mesh up to 4000 mesh, e.g. those commercially available from Disco Corporation. It emerges during the conversion into particle sizes that, by way of example, 1200 mesh corresponds to an average particle size of 9.5 $\mu$m, 5000 mesh corresponds to an average particle size of 2.5 $\mu$m and 8000 mesh corresponds to an average particle size of 1.2 $\mu$m.

The average particle sizes during fine grinding are from approximately 3 $\mu$m up to 10 $\mu$m. If grinding discs having coarse granulation are used, the average grain size is greater than 10 $\mu$m and usually up to 15 $\mu$m. These grinding machining tools are suitable for providing the semiconductor wafer with a rounded edge. It is usual, however, for a certain minimum roughness to remain on the edge surface after the edge rounding.

In a subsequent machining step, the wafer edge that has been ground and treated with an etching medium is therefore usually polished. For polishing, the edge of a centrally rotating semiconductor wafer is pressed against a centrally rotating polishing drum with a specific force (contact pressure). U.S. Pat. No. 5,989,105 discloses an edge polishing method of this type, in which the polishing drum comprises an aluminum alloy and a polishing pad is applied to the polishing drum. The semiconductor wafer is usually fixed on a flat wafer holder, a so-called "chuck." The edge of the semiconductor wafer projects beyond the chuck, such that it is freely accessible to the polishing drum.

In these customary edge polishing methods, in particular the local geometry in the edge region of the semiconductor wafer is adversely influenced. This is associated with the fact that with the relatively "soft edge polishing pads" used in this case (relatively soft polishing pads to which silica sol is applied are usually used), not only the edge itself but also an outer part on the front and/or rear side of the semiconductor wafer is polished as well, which can be explained by the hard edge "dipping" into the polishing pad to which polishing agent slurry is applied. This has the effect that removal is indeed effected not only in the region of the actual edge but also in the adjoining region on the front and/or rear side.

SUMMARY OF THE INVENTION

It was an object of the invention to offer a solution to the problems described above and to avoid the disadvantages of the prior art. These and other objects are achieved by means of a method for polishing the edge of a semiconductor wafer, comprising: (a) providing a semiconductor wafer which has been polished on its side surfaces and which has a rounded edge; (b) polishing the edge of the semiconductor wafer by fixing the semiconductor wafer on a centrally rotating chuck, delivering the semiconductor wafer and a centrally rotating polishing drum, which is inclined with respect to the chuck and to which a polishing pad, containing fixedly bonded abrasives, is applied, and pressing semiconductor wafer and polishing drum onto one another while a polishing agent solution containing no solids is continuously supplied.

DETAILED DESCRIPTION OF THE PREFERRED EMBODIMENT(S)

The invention is based on a sequential edge polishing on the basis of fixed abrasive polishing technology. By means of the latter, it is possible to influence the wafer edge in a targeted manner without impairing the adjoining region of front and/or rear side of the semiconductor wafer, and thus for example to set the desired geometry and surface properties only on the wafer edge.

The FAP pad used is significantly harder and much less compressible than the polishing pads used as standard and affords the advantage, moreover, of producing material removal without alkaline loaded silica sol, e.g. just by using an alkaline solution, which additionally avoids polishing agent entrainment onto the front side of the wafer and thus additional adverse influences on the wafer surface, e.g. increased defect rates such as e.g. LLS (localized light scatterers), on account of incipient etching.

A short soft polishing step using softly removing silica sol can subsequently be effected as required on the same FA polishing pad, in order to realize a reduction of the edge roughness and edge defect rates.

The two polishing steps can be coordinated with one another such that a targeted positive influencing of the wafer edge geometry and surface can be performed without adversely influencing the wafer partial sites on the wafer front side and wafer rear side.

Firstly, a semiconductor wafer that has been polished by means of DSP (double-side polishing) is provided. The semiconductor wafer has a rounded edge (produced by means of an edge grinding method explained previously in the prior art). The semiconductor wafer is polished by means of a polishing drum, adhesively bonded on the surface of which is a hard and not very compressible polishing pad containing fixedly bonded abrasives, while an alkaline solution is supplied.

Preferably, a smoothing step is subsequently effected in a second step on the same polishing pad while a silica sol is supplied, such as e.g. Glanzox 3900 with approximately 1% by weight of $SiO_2$. Glanzox 3900 is the product name for a polishing agent slurry offered as a concentrate by Fujimi Incorporated, Japan. The base solution of this concentrate has a pH of 10.5 and contains approximately 9% by weight of colloidal $SiO_2$ having an average particle size of 30 to 40 nm.

It has been found that impairment of the local geometry in the edge region of the semiconductor wafer as observed in the prior art is avoided by the method according to the invention. A further advantage is that polishing agent entrainments in the removing step of the edge polishing and thus the occurrence of surface defects on account of uncontrolled incipient etching on the wafer surface are avoided.

The invention is directed in particular to the machining of semiconductor wafers having a diameter of 300 mm, or greater, most preferably having a diameter of 450 mm. Silicon is particularly preferred as semiconductor material.

The polishing agent solution used during the edge polishing is, in the simplest case, water, preferably deionized water (DIW) having the purity customary for use in the semiconductor industry. However, the polishing agent solution can also contain compounds such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) or any desired mixtures thereof. The use of potassium carbonate is especially preferred.

The pH value of the polishing agent solution preferably lies in a range of 10 to 12 and the proportion of the compounds recited above in the polishing agent solution is preferably 0.01 to 10% by weight, more preferably from 0.01 to 0.2% by weight.

The polishing agent solution can furthermore contain one or more further additives, for example surface-active additives such as wetting agents and surfactants, stabilizers acting as protective colloids, preservatives, biocides, alcohols and complexing agents.

A polishing agent containing abrasives is used in the preferred second step of the edge polishing. The proportion of the abrasive material in the polishing agent slurry is preferably 0.25 to 20% by weight, more preferably 0.25 to 1% by weight. The size distribution of the abrasive material particles is preferably markedly monomodal, and the average particle size is 5 to 300 nm, more preferably 5 to 50 nm.

The abrasive material comprises a material that mechanically removes the substrate material, preferably one or more of the oxides of the elements aluminum, cerium or silicon. A polishing agent slurry containing colloidally disperse silica is particularly preferred.

In the second step of the edge polishing, in contrast to the first step, preferably no additives such as sodium carbonate ($Na_2CO_3$), potassium carbonate ($K_2CO_3$), sodium hydroxide (NaOH), potassium hydroxide (KOH), ammonium hydroxide ($NH_4OH$), or tetramethylammonium hydroxide (TMAH) are added. However, the polishing agent slurry can contain one or more further additives, for example surface-active additives such as wetting agents and surfactants, stabilizers acting as protective colloids, preservatives, biocides, alcohols and complexing agents.

The method according to the invention uses a polishing pad containing an abrasive material bonded in the polishing pad (FAP pad or FA Pad). Suitable abrasive materials comprise for example particles of oxides of the elements cerium, aluminum, silicon, zirconium and particles of hard materials such as silicon carbide, boron nitride and diamond.

Particularly suitable polishing pads have a surface topography characterized by replicated microstructures. The microstructures ("posts") have for example the form of columns having a cylindrical or polygonal cross section or the form of pyramids or truncated pyramids. More detailed descriptions of such polishing pads are contained for example in WO 92/13680 A1 and U.S. 2005/227590 A1. The use of cerium oxide particles bonded in the polishing pad is particularly preferred, cf. also U.S. Pat. No. 6,602,117 B1. The average particle size of the FAP polishing pad is preferably 0.1-1.0 µm, more preferably 0.1-0.25 µm.

A polishing pad having a multilayered construction comprising a layer containing abrasives, a layer composed of a stiff plastic and also a compliant, non-woven layer, wherein the layers are bonded to one another by means of pressure-sensitive adhesive layers, is particularly suitable for carrying out the method.

The layer composed of a stiff plastic preferably comprises polycarbonate, and the polishing pad can contain an additional layer composed of polyurethane foam. In this case, one of the layers of the polishing pad is compliant. The compliant layer is preferably a non-woven layer, and preferably comprises polyester fibers. A layer composed of polyester fibers impregnated with polyurethane is particularly suitable ("nonwoven"). By means of the compliant layer, the pad height can be adapted and follow continuous transitions.

The compliant layer preferably corresponds to the bottommost layer of the polishing pad. Situated above the bottommost layer is preferably a foam layer composed of polyurethane, for example, which is fixed on the compliant layer by means of an adhesive layer. Situated above the PU foam is a layer composed of a harder, stiff material, preferably composed of a hard plastic, for which polycarbonate, for example, is suitable. Situated above this stiff layer is the layer having the microreplicated structures, that is to say the actual fixed abrasive layer. However, the compliant layer can also be situated between the foam layer and the stiff layer or directly below the fixed abrasive layer. The various layers are fixed to one another preferably by means of pressure-sensitive adhesive layers (PSA).

The inventor has surprisingly discovered that a polishing pad without the PU foam layer that is always present in the prior art of FAP polishing pads leads to particularly good results. In this case, the polishing pad comprises a layer having the microreplicated structures, a compliant layer and a layer composed of a stiff plastic such as polycarbonate, wherein the compliant layer can be either the middle or the bottommost layer of the polishing pad.

These novel polishing pads are suitable in particular for use in a multi-plate polishing machine (e.g. the AMAT Reflection from Applied Materials, Inc.). This polishing machine comprises a 5 zone membrane carrier, which permits the pressure profile of the carrier to be set differently in 5 zones. In conjunction with the compliant polishing pads, this leads to outstanding results with regard to the geometry of the polished wafers.

The grain sizes of the FAP polishing pads are preferably greater than or equal to 0.1 μm and less than or equal to 1.0 μm, more preferably 0.1-0.25 μm. Commercially available automatic edge polishing machines are suitable for carrying out the method according to the invention.

In this case, the semiconductor wafer is fixed on a centrally rotating chuck, with the semiconductor wafer projecting beyond the chuck. A centrally rotating polishing drum, which is inclined by a specific angle with respect to the chuck and to which the FAP polishing pad is applied, and the chuck with the semiconductor wafer are delivered to one another and pressed onto one another with a specific contact pressure while the polishing agent is continuously supplied. During edge polishing, the chuck with the semiconductor wafer held on it is rotated centrally. Preferably, one revolution of the chuck lasts 20-300 s, particularly preferably 50-150 s (revolution time).

A polishing drum, which is covered with the polishing pad and is preferably rotated centrally at a rotational speed of 300 1500 min$^{-1}$, more preferably 500-1000 min$^{-1}$, and the chuck are delivered to one another, the polishing drum being set obliquely at a setting angle with respect to the semiconductor wafer and the semiconductor wafer being fixed on the chuck in such a way that it projects slightly beyond the chuck and is thus accessible to the polishing drum. The setting angle is preferably 30-50°.

The semiconductor wafer and polishing drum are pressed onto one another with a specific contact pressure while a polishing agent is continuously supplied, preferably with a polishing agent flow rate of 0.1-1 liter/min, more preferably 0.15-0.40 liter/min, wherein the contact pressure can be set by means of weights attached to rolls and is preferably 1-5 kg, particularly preferably 2-4 kg. Polishing drum and semiconductor wafer are preferably moved away from one another after 2-20, more preferably after 2-8, revolutions of the semiconductor wafer or of the chuck holding the semiconductor wafer.

EXAMPLE

For an edge polishing machine of the Speedfam EP300-IV type, by way of example the following setting parameters are suitable for carrying out the method according to the invention (a range that is preferred when carrying out the method according to the invention is specified, if appropriate, between parentheses):

contact pressure during polishing: 3.0 kg (1.0-5.0 kg)
rotational speed of polishing drum: 800 RPM (300-1500 RPM)
rotational speeds of chuck/semiconductor wafer: 85 sec/revolution (20-300 sec/revolution)
revolutions of the semiconductor wafer: 4 (2-20 revolutions)
polishing agent flow rate: 300 ml/min (100-1000 ml/min)
polishing agent concentration: e.g. 0.8% K2CO3 (unimportant, any other desired concentrations possible)
type of polishing agent: e.g. 5% SiO$_2$ Levasil™ 200 from Bayer, many others are conceivable
setting angle of polishing drum with respect to the wafer: 40° (30-50°)
polishing pad: fixed abrasive polishing pads e.g. comprising cerium oxide particles, particle sizes 0.1-0.25 μm
polishing duration: 340 sec (150-600 sec)

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method for polishing the edge of a semiconductor wafer, comprising: (a) providing a semiconductor wafer which has been polished on its side surfaces and which has a rounded edge; (b) polishing the edge of the semiconductor wafer by fixing the semiconductor wafer on a centrally rotating chuck, delivering the semiconductor wafer to a centrally rotating polishing drum which is inclined with respect to the chuck and to which a polishing pad containing fixedly bonded abrasives is applied, and pressing semiconductor wafer and polishing drum onto one another while a polishing agent solution containing no solids is continuously supplied.

2. The method of claim 1, wherein the polishing agent solution is water or an aqueous solution of one or more of the compounds sodium carbonate (Na$_2$CO$_3$), potassium carbonate (K$_2$CO$_3$), sodium hydroxide (NaOH), potassium hydroxide (KOH), ammonium hydroxide (NH$_4$OH), and tetramethylammonium hydroxide (TMAH).

3. The method of claim 2, wherein the pH of the polishing agent solution is 10 to 12 and the proportion of the compounds in the polishing agent solution is 0.01 to 10% by weight.

4. The method of claim 1, wherein after a first edge polishing, c) a second edge polishing takes place, but with a polishing agent slurry that contains abrasives being supplied.

5. The method of claim 4, wherein the proportion of the abrasive material in the polishing agent slurry in accordance with step c) is preferably 0.25 to 20% by weight.

6. The method of claim 4, wherein the abrasive material in the polishing agent slurry comprises one or more of the oxides of the elements aluminum, cerium or silicon.

7. The method of claim 6, wherein the polishing agent slurry contains colloidal silica.

8. The method of claim 7, wherein the pH of the polishing agent slurry lies in the range of 9 to 11.5.

9. The method of claim 8, wherein the pH of the polishing agent slurry is set by means of one or more of sodium carbonate (Na$_2$CO$_3$), potassium carbonate (K$_2$CO$_3$), sodium hydroxide (NaOH), potassium hydroxide (KOH), ammonium hydroxide (NH$_4$OH), and tetramethylammonium hydroxide (TMAH).

10. The method of claim 1, wherein the polishing pad contains abrasive materials selected from particles of oxides of the elements cerium, aluminum, silicon or zirconium or particles of hard materials silicon carbide, boron nitride or diamond.

11. The method of claim 10, wherein the polishing pad contains cerium oxide particles.

12. The method of claim 10, wherein the average particle size of the abrasives is 0.1-1 μm.

13. The method of claim 12, wherein the average particle size of the abrasives is 0.1-0.25 μm.

14. The method of claim 10, wherein the polishing pad comprises, in addition to a layer containing abrasive materials, a layer composed of a stiff plastic and also a compliant, non-woven layer, wherein the layers are bonded to one another by means of pressure-sensitive adhesive layers.

15. The method of claim 14, wherein the layer composed of a stiff plastic comprises a polycarbonate.

16. The method of claim 14, wherein the polishing pad comprises an additional layer composed of polyurethane foam.

17. The method of claim 14, wherein the compliant layer comprises polyester fibers.

18. The method of claim 1, wherein the semiconductor wafer is a wafer composed of monocrystalline silicon having a diameter of 300 mm or greater.

* * * * *